United States Patent
Son et al.

(10) Patent No.: US 8,411,510 B2
(45) Date of Patent: Apr. 2, 2013

(54) FLASH MEMORY DEVICE, MEMORY SYSTEM AND METHOD OF OPERATING THE SAME

(75) Inventors: Hong-Rak Son, Anyang-si (KR); Han-Woong Yoo, Seoul (KR); Jun-Jin Kong, Yongin-si (KR); Hee-Seok Eun, Hwaseong-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 209 days.

(21) Appl. No.: 13/040,456

(22) Filed: Mar. 4, 2011

(65) Prior Publication Data

US 2011/0216589 A1  Sep. 8, 2011

(30) Foreign Application Priority Data

Mar. 4, 2010 (KR) .................. 10-2010-0019257

(51) Int. Cl.
*G11C 16/04* (2006.01)
*G06F 12/00* (2006.01)
*G06F 13/00* (2006.01)

(52) U.S. Cl. ......... 365/185.24; 365/185.02; 365/185.03; 711/103; 711/E12.008

(58) Field of Classification Search ............. 365/185.24
See application file for complete search history.

(56) References Cited

U.S. PATENT DOCUMENTS

| | | | |
|---|---|---|---|
| 7,782,669 B2 * | 8/2010 | Sukegawa | 365/185.03 |
| 2008/0106937 A1 * | 5/2008 | Magnavacca et al. | 365/185.03 |
| 2011/0246703 A1 * | 10/2011 | Franceschini et al. | 711/103 |
| 2012/0023283 A1 * | 1/2012 | Yang | 711/103 |

FOREIGN PATENT DOCUMENTS

| | | |
|---|---|---|
| JP | 05-210994 | 8/1993 |
| JP | 07-021088 | 1/1995 |
| KR | 10-2008-0107921 | 12/2008 |

* cited by examiner

*Primary Examiner* — Son Mai
(74) *Attorney, Agent, or Firm* — Muir Patent Consulting, PLLC

(57) ABSTRACT

A memory system includes a memory device and a data converting device. The memory device includes a memory cell array which includes a plurality of memory cells. The data converting device includes an encoding device. The encoding device converts input data into converted data by changing a bandwidth corresponding to the input data, and provides the converted data to the memory device. Accordingly, the memory system is capable of improving the reliability of programmed data by changing the bandwidth corresponding to data to be programmed. A method of storing data in a memory system is also disclosed.

20 Claims, 19 Drawing Sheets

FIG. 3A
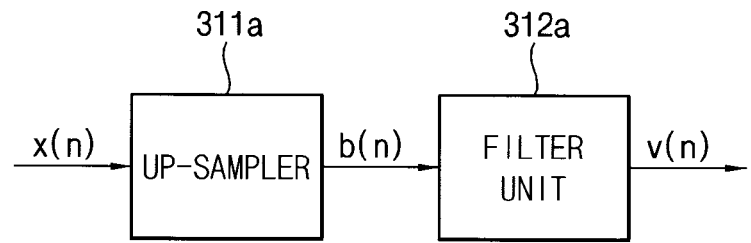
FIG. 3B
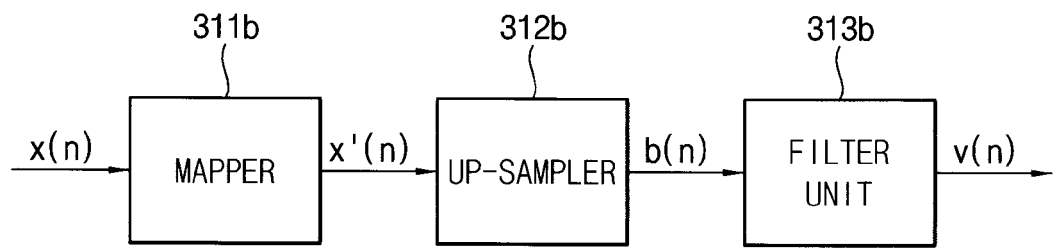
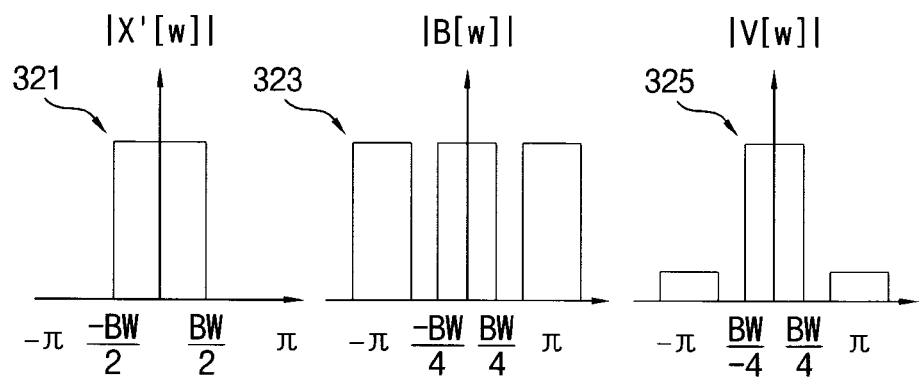

FIG. 6A
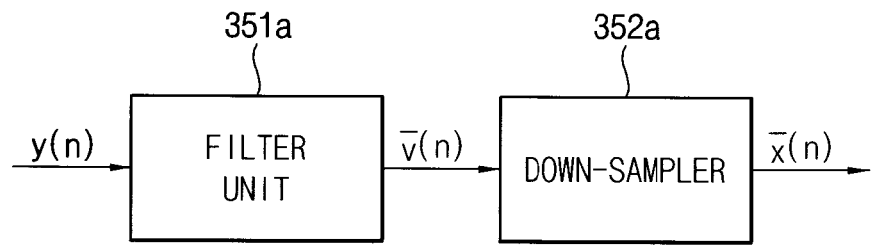
FIG. 6B
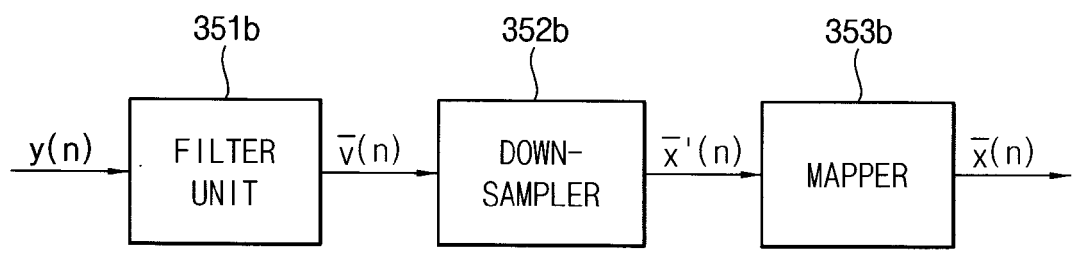
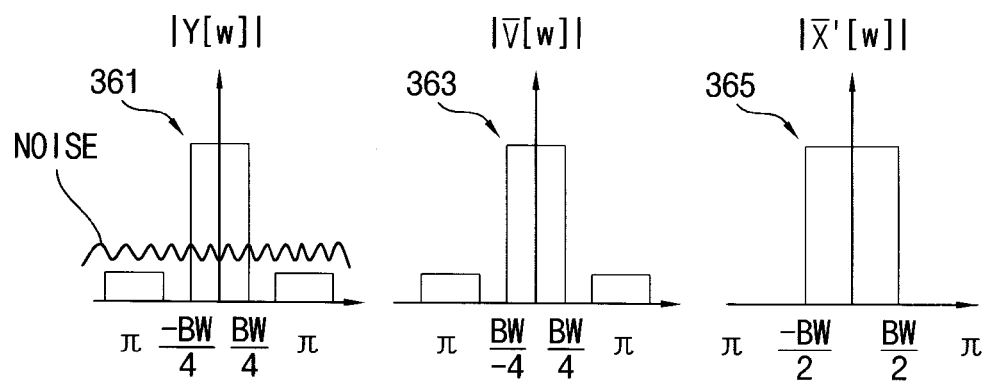

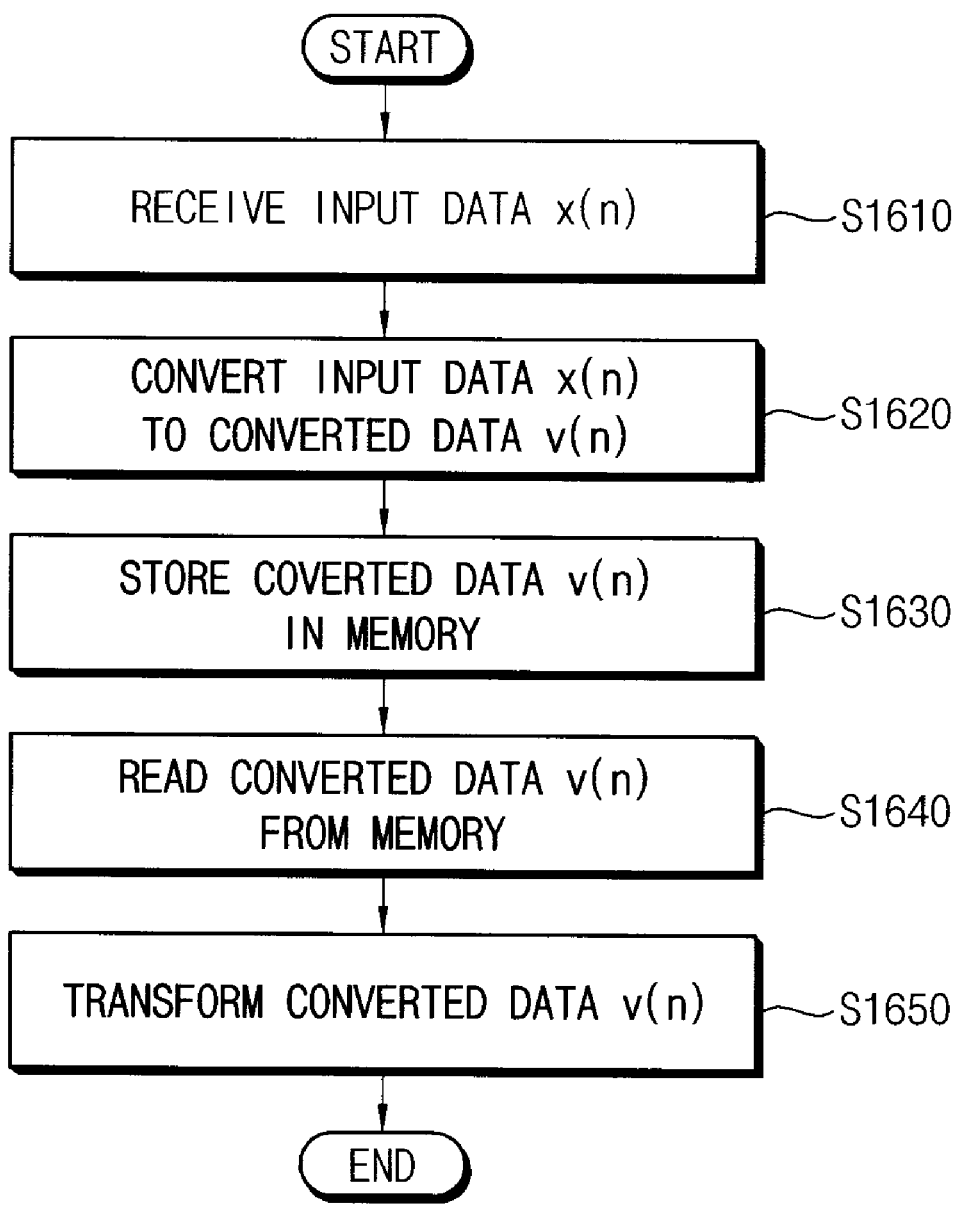

FLASH MEMORY DEVICE, MEMORY SYSTEM AND METHOD OF OPERATING THE SAME

CROSS-REFERENCE TO RELATED APPLICATION(S)

This application claims priority under 35 USC §119 to Korean Patent Application No. 10-2010-0019257, filed on Mar. 4, 2010, in the Korean Intellectual Property Office (KIPO), the contents of which are incorporated herein in its entirety by reference.

BACKGROUND

1. Technical Field

Example embodiments relate to semiconductor devices, more particularly to a memory system capable of reducing coupling effect between memory cells.

2. Description of the Related Art

In general, a non-volatile semiconductor memory device such as a flash memory device includes a memory cell array which have erased or programmed memory cells. The memory cells of the memory cell array have threshold voltage distributions corresponding to data stored in the memory cells. In general, the flash memory device may include single level cells (SLC), where each memory cell stores a single bit of data. Other flash memories may store multiple bits of data in each memory cell, these memory cells (and memories) are often referred to as multi-level cells (MLC). In general, each of the multi-level cells is capable of storing two or more bits of data. Regarding a multi-level cell which stores N bits, the multi-level cell may have a threshold voltage which corresponds to a distribution (or threshold range) among the $2^N$ possible distributions of threshold voltages (or threshold ranges). The threshold voltage of the memory cell represents the data stored therein.

As the distance between memory cells becomes smaller according to advances in manufacturing technology of semiconductor devices, a coupling effect between nearby memory cells may affect the actual and/or apparent threshold voltage of a nearby cell. Strong coupling effect may alter an actual or apparent threshold voltage of a memory cell such that data of the cell intended to be stored within one threshold distribution (or within one range) may be detected as a threshold value within another threshold distribution, and thus read out of the memory as different data. Thus, the reliability of data stored in a memory device which is affected by such coupling effect may be reduced because of the shifted threshold voltages. Further, and such reliability problem may become more significant when the number of bits to be stored in a memory cell is increased.

SUMMARY

Some example embodiments provide memory systems capable of improving the reliability of data stored in memory cells.

According to some example embodiments, a memory system includes a memory device and a data converting device. The memory device includes a memory cell array which includes a plurality of memory cells. The memory device alters a threshold value of corresponding ones of the plurality of memory cells to store corresponding data. Further programming of one or more neighboring cells of a first memory cell is effective to alter a reading of the threshold value of the first cell. The data converting device includes an encoding device. The encoding device converts input data into converted data by lowering a threshold deviation between neighboring cells corresponding to the input data, and provides the converted data to the memory device. The bandwidth represents a range of a threshold variation per unit length of a line of memory cells along a length of the memory device when corresponding data were to be stored in the line of memory cells.

The encoding device may perform an interpolation operation on the input data to generate the converted data.

The encoding device may include an up-sampler and a filter unit. The up-sampler may perform an up-sampling operation on the input data. The filter unit may filter the up-sampled input data to generate the converted data.

The filter unit may include a first filter, a second filter and a third filter. The first filter may filter the up-sampled input data to remove repeated images of the up-sampled input data in frequency domain. The second filter may perform a pulse-shaping operation on an output of the first filter. The third filter may reduce a mismatch of an output of the second filter with a down-sampler connected to the third filter.

The up-sampler may reduce a bandwidth corresponding to the input data such that the up-sampled input data has a bandwidth corresponding to an up-sampling frequency.

The encoding device may further include a mapper. The mapper may perform a mapping operation on the input data, and may provide the mapped input data to the up-sampler.

The mapper may perform the mapping operation on the input data based on threshold voltage levels of programmed memory cells.

The mapper may perform the mapping operation on the input data based on distributions of threshold voltage levels of programmed memory cells.

The encoding device may generate the converted data by further performing decimation operation on the input data.

The data converting device may further include a decoding device. The decoding device may convert read data through a reverse process with respect to a converting process of the encoding device and may output the converted read data as an output data. The read data may be read from the memory cell array.

The decoding device may perform decimation operation on the read data and outputs the decimated read data as the output data.

The decoding device may include a filter unit and a down-sampler. The filter unit may filter the read data. The down-sampler may perform a down-sampling operation on the filtered read data and may output the down-sampled read data as the output data.

The decoding device may further include a mapper. The mapper may perform a mapping operation on the down-sampled read data to generate mapped data, and may output the mapped data as the output data.

The down-sampler may increase a bandwidth of the filtered read data so that the down-sampled read data has a bandwidth corresponding to a down-sampling frequency.

The decoding device may include a first filter unit, an up-sampler, a second filter unit, a down-sampler and a mapper. The first filter unit may perform a low-pass filtering operation on the read data. The up-sampler may perform an up-sampling operation on the low-pass filtered read data to generate up-sampled data. The second filter unit may filter the up-sampled data to generate filtered data. The down-sampler may perform a down-sampling operation on the filtered data to generate down-sampled data. The mapper may perform a mapping operation on the down-sampled data and may output the mapped down-sampled data as the output data.

Each of the memory cells may be a multi-level memory cell.

According to some example embodiment, a flash memory device includes a flash memory and a flash memory controller. The flash memory controller includes an encoder and a decoder. The encoder is operative to receive data from a host system, encode the received data and provide the encoded data to the flash memory during a program operation of the flash memory to store the encoded data to a page of the flash memory. The decoder is operative to receive encoded data from the flash memory, decode the encoded data from the flash memory during a read operation. The encoding by the encoder is operative to reduce an amount of threshold voltage variations between adjacent cells of the page of the flash memory storing the encoded data that as compared to an amount of threshold voltage variations between adjacent cells of the page of the flash memory which would have occurred upon storing the received data without conversion by the encoder.

The reduced amount of threshold variations may include a reduction of an average magnitude of threshold voltage differential of adjacent memory cells along the page of the flash memory.

In a method of operating a flash memory device according to some example embodiments, input data is received. Data elements of the input data is represented in a sequence of data elements of the input data and each data element has one of a plurality of threshold voltages to represent the input data in a multi-level cell flash memory. The input data is converted to converted data. The converted data is represented in a sequence of data elements of the converted data and each data element of the converted data has one of the plurality of threshold voltages to represent the converted data in the multi-level cell flash memory. The converted data is stored in a page of flash memory in a sequence of memory cells along the page of flash memory corresponding to the sequence of data elements of the converted data. While the input data is converted to the converted data, an amount of threshold variations among adjacent cells along the page of flash memory is reduced as compared to an amount of threshold variations among adjacent memory cells along the page of flash memory which would have occurred if the received input data had been stored in the page of the flash memory in the sequence of data elements of the input data.

The reduced amount of threshold variations may include a reduction of an average magnitude of threshold voltage differential of adjacent memory cells along the page of the flash memory.

Accordingly, memory systems according to example embodiments are capable of improving the reliability of programmed data through changing the bandwidth corresponding to data to be programmed into the memory cell array.

BRIEF DESCRIPTION OF THE DRAWINGS

Illustrative, non-limiting example embodiments will be more clearly understood from the following detailed description taken in conjunction with the accompanying drawings.

FIGS. 3A, 3B, 3C and 3D are diagrams illustrating examples of an encoding device in the controller of FIG. 2 according to some example embodiments.

FIGS. 5A and 3B are block diagrams illustrating examples of encoding devices in the controller of FIG. 2 according to some example embodiments.

FIGS. 6A, 6B, 6C and 6D are diagrams illustrating examples of decoding devices in the controller of FIG. 2 according to some example embodiments.

FIG. 16 is a flowchart illustrating an exemplary method.

DETAILED DESCRIPTION

Figure 1:
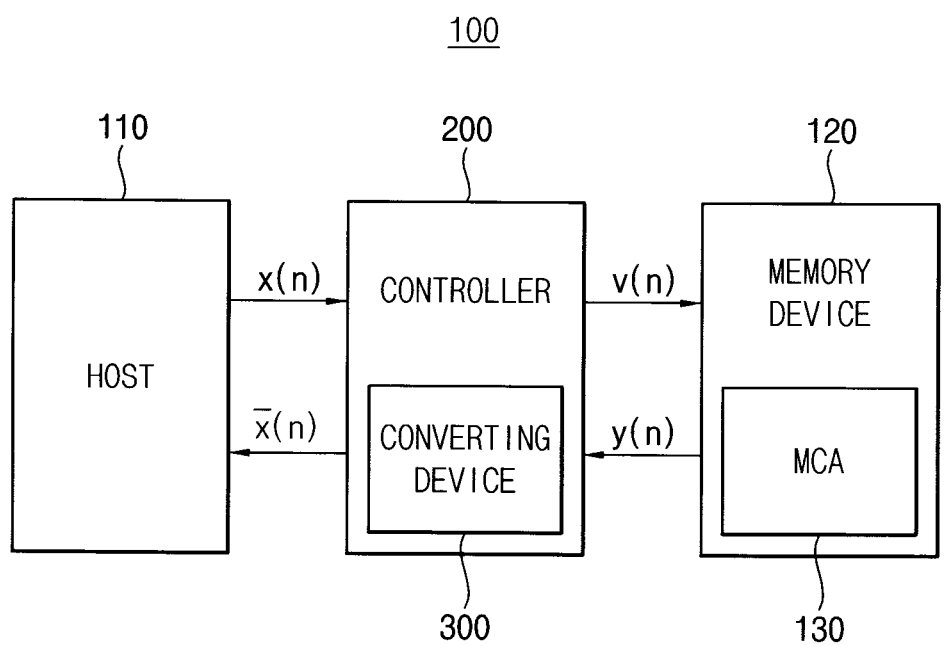
FIG. 1 is a block diagram illustrating a memory system according to an example embodiment.

Various example embodiments will be described more fully hereinafter with reference to the accompanying drawings, in which some example embodiments are shown. Note that the invention be embodied in many different forms and should not be construed as limited to the example embodiments set forth herein. In the drawings, the layout and relative sizes of elements may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a memory system according to an example embodiment.

Referring to FIG. 1, a memory system 100 includes at least one memory device 120, a host 110 and a controller 200.

The controller 200 may include a converting device 300 according to some example embodiments. The converting device 300 may be installed externally from the controller 200 rather than installed in the controller 200. In this case, the converting device 300 may be connected to the host 110 and the at least one memory device 120. The at least one memory device 120 includes a memory cell array (MCA) 130 which includes a plurality of memory cells. Each of the memory cells may be a multi-level memory cell. The controller 200 may be implemented in software, firmware and/or dedicated hardware. For example, controller 200 may be implemented by a general purpose computer, general purpose microprocessor, or a general purpose controller. Alternatively, the controller 200 may be digital signal processor or a specially designed memory controller implemented on a single semiconductor chip. The converting device 300 may be an integral element of the controller 200 and data processing operations of the converting device 300 (discussed below) may be simply be one part of the overall operation of the controller 200. Alternatively, the converting device 300 may be distinct and possibly separate from controller 200 (e.g., such as a separate function block within a semiconductor chip shared by the controller, or a separate chip entirely). For convenience of explanation, it will be assumed that the converting device 300 is included in the controller 200. However, the scope of the present invention is not limited thereof.

The controller 200 or the converting device 300 receives input data x[n] from the host 100. For example, data x[n] represents data to be stored in a page of flash memory. Each data element x[i] may represent multiple bits to be stored in a corresponding multi-level cell at location i along the page of memory. During a program operation mode, the controller 200 or the converting device 300 converts the input data x[n] into converted data v[n]. This conversion of the data x[n] to converted data v[n] may be performed by changing a bandwidth corresponding to the input data x[n] to provide the converted data v[n] to the at least one memory device 120. The frequency of the input data may be viewed as a variation of threshold values corresponding to data x[n] on a per unit distance along a page of flash memory (or alternatively, per unit time when the data is received synchronously and sequentially). converting device 300 receives read data y[n] from the at least one memory device 120, converts the read data y[n] and provides the converted read data as output data x[n] to the host 110 during a read operation mode. Data y[n] may correspond to data v[n] and data x[n] may correspond to data x[n] in some operations in some embodiments.

In some example embodiments, the at least one memory device 120 may include a flash memory device. For example, the at least on memory device 120 may include a NAND flash memory device. The NAND flash memory device may have a multi-level type memory device. The at least one memory device 120 programs the converted data v[n] into the memory cell array 130.

Figure 2:
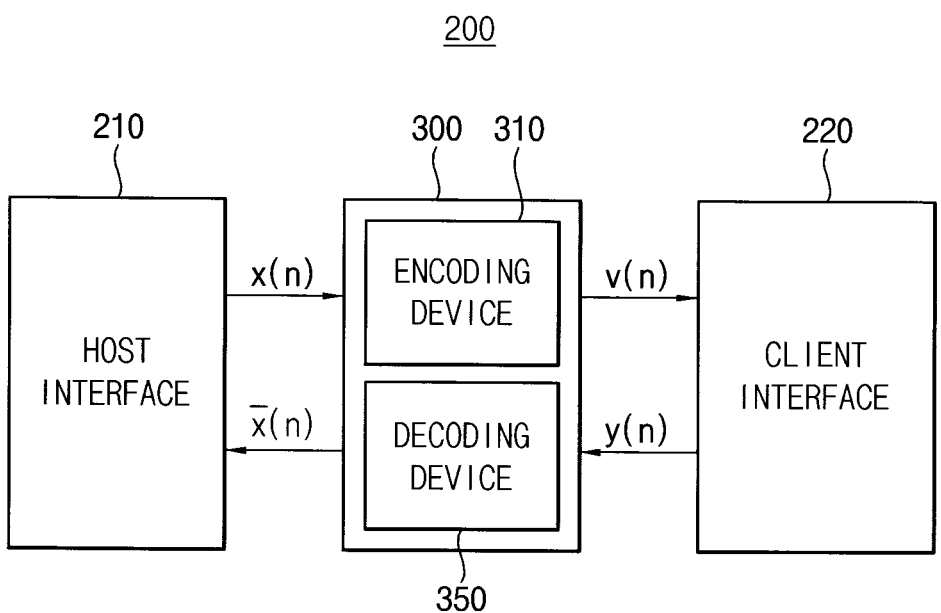
FIG. 2 is a block diagram illustrating an example of a controller in the memory system of FIG. 1 according to some example embodiments.

FIG. 2 is a block diagram illustrating a controller in the memory system of FIG. 1 according to some example embodiments.

Referring to FIG. 2, the controller 200 may include a converting device 300, a host 100, a host interface 210 and a client interface 220. The host interface 210 may communicate with the host 110 using standard interface protocols such as universal serial bus (USB) and serial ATA (SATA). The client interface 220 may communicate with the at least one memory device 120 using memory interface protocols. In some example embodiments, the controller 200 may be a memory controller.

The converting device 300 may include an encoding device 310 and a decoding device 350. The encoding device 300 converts input data x[n] into converted data v[n] by changing a bandwidth corresponding to the input data x[n], and may provide the converted data v[n] to the at least one memory device 120. The encoding device 310 may perform an interpolation operation on the input data x[n] to generate the converted data v[n] and provides the converted data v[n] to the at least one memory device 120. The encoding device 310 may perform additional and/alternative operations on the input data x[n]. The decoding device 350 may convert read data y[n] through a reverse process with respect to a converting process of the encoding device 310 and may provide the converted read data x[n] to the host 110. For example, the decoding device 350 may perform a decimation operation on the read data y[n] and may provide the decimated read data as the output data x[n] to the host 110. In certain uses of the memory system, it may be acceptable for decoder 350 to perform a decoding operation on data y[n] such that data x[n] is not fully retrieved and acceptable variations exist between x[n] and x[n]. For example, when data to be stored is music and/or pictures, variations between x[n] and x[n] may be acceptable. In other uses of the memory system, variations between x[n] and x[n] may not be acceptable and the decoder 350 would operate to fully recover data x[n], such that x[n] is the same as x[n].

FIGS. 3A, 3B, 3C and 3D are diagrams illustrating examples of an encoding device in the controller of FIG. 2 according to some example embodiments.

Referring to FIG. 3A, an encoding device 310a may include an up-sampler 311a and a filter unit 312a. The up-sampler 311a may perform an up-sampling operation on the input data x[n] to generate up-sampled data b[n]. The filter unit 312a may filter the up-sampled data b[n] to generate the converted data v[n]. In some embodiments, the filter unit 312a may be implemented as a low-pass filter. In this case, the filter unit 312a may perform a low-pass filtering on the up-sampled data b[n] to output the converted data v[n]. In one example, the up-sampling operation may perform a zero-padding operation, inserting dummy data (such a zero and/or erase data) between adjacent ones of input data x[n] (e.g., inserting dummy data between data x[i] and x[i+1]). The filter unit 312a may act to perform a pseudo-filter operation resulting in replacing the dummy data with data representing an interpolation and/or average of data of adjacent cells (e.g., data representing an interpolation and/or average of data x[i] and x[i+1] would be inserted between data x[i] and x[i+1]).

Referring to FIG. 3B, an encoding device 310b may include a mapper 311b, an up-sampler 312b and a filter unit 313b. The mapper 311b may perform a mapping operation on the input data x[n] based on the mapping rule to generate mapped data x'[n], and may provide the mapped data x'[n] to the up-sampler 312b. The up-sampler 312b may perform an up-sampling operation on the mapped data x'[n] to generate up-sampled data b[n]. The filter unit 313b may filter the up-sampled data b[n] to generate the converted data v[n]. In some example embodiments, the filter unit 313b may be implemented as a low-pass filter. In this case, the filter unit 313b may perform a low-pass filtering on the up-sampled data b[n] to output the converted data v[n]. The mapper 313b may group or otherwise organize data x(n) in some predetermined manner. For example, mapper 311b may group multiple data elements (e.g., x[i] and x[i+1]) into a single data element having twice as many bits. Example operations of the mapper 311b will be described below with reference to FIG. 12.

In FIG. 3B, reference numerals 321, 323 and 325 represent images of the mapped data x'[n], up-sampled data b[n] and the converted data v[n], respectively, in frequency domain, which are obtained through time-to-frequency transformation such as Fourier transformation. For example, X'[w], B[w] and V[w] indicate Fourier transformed data of the mapped data x'[n], the up-sampled data b[n] and the converted data v[n], respectively. For convenience of explanation, the mapped data x'[n] is assumed to be spread between −BW/2 to BW/2 in frequency domain. In this case, the converted data v[n] may be spread between −BW/4 and BW/4 when the mapped data x'[n] is interpolated by 2 in order to generate up-sampled data b[n].

Figure 3C:
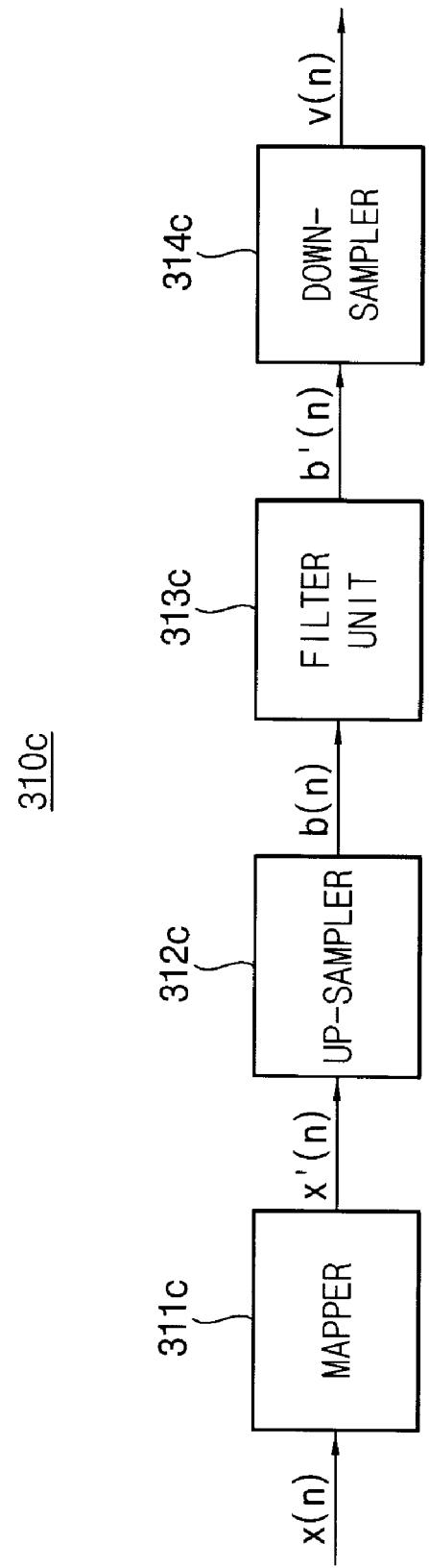

Referring to FIG. 3C, an encoding device 310c may include a mapper 311c, an up-sampler 312c, a filter unit 313c and down-sampler 314c. The mapper 311c may perform a mapping operation on the input data x[n] based on the mapping rule to generate mapped data x'[n], and may provide the mapped data x'[n] to the up-sampler 312c. The up-sampler 312c may perform an up-sampling operation on the mapped data x'[n] to generate up-sampled data b[n]. The filter unit 313c may filter the up-sampled data b[n] to generate the filtered data b'[n]. In some example embodiments, the filter unit 313c may be implemented as a mixed filter. The down-sampler 314c may perform a down-sampling operation on the filtered data b'[n] to generate the converted data v[n]. Accordingly, the example embodiment described with reference to FIG. 3C, which includes the down-sampler 314c, may reduce the amount of data to be programmed in the memory device 120 of FIG. 1.

Figure 3D:
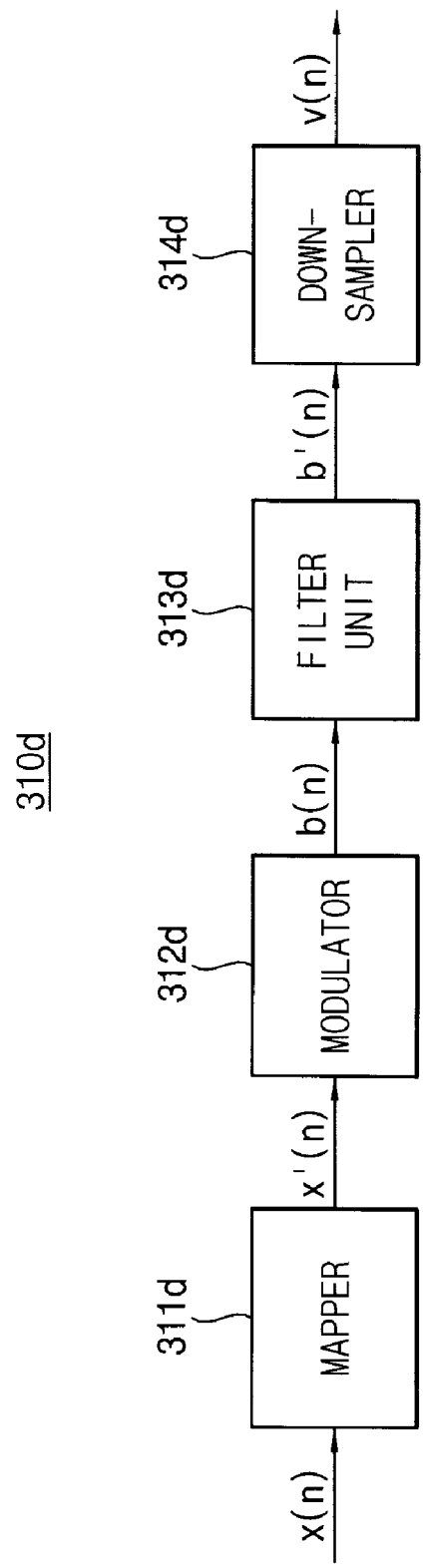

Referring to FIG. 3d, an encoding device 310d may include a mapper 311d, a modulator 312d, a filter unit 313d and down-sampler 314d. The mapper 311d may perform a mapping operation on the input data x[n] based on the mapping rule to generate mapped data x'[n], and may provide the mapped data x'[n] to the modulator 312d. The modulator 312d may modulate the mapped data x'[n] to generate up-sampled data b[n]. Thus, the modulator 312d functions similarly to the up-sampler 312c of FIG. 3C. The filter unit 313d may filter the up-sampled data b[n] to generate the filtered data b'[n]. In some example embodiments, the filter unit 313c may be implemented as a mixed filter. The down-sampler 314d may perform a down-sampling operation on the filtered data b'[n] to generate the converted data v[n].

Accordingly, encoding devices according to FIGS. 3C and 3D, which include up-samplers and down-samplers, may perform interpolation operation and decimation operation on the input data x[n] to generate the converted data v[n].

Figure 4:
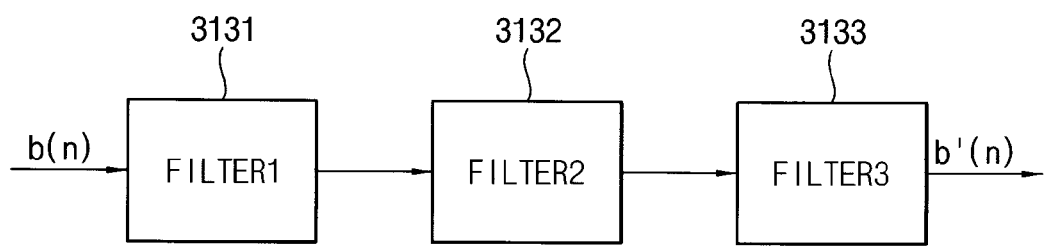
FIG. 4 is a block diagram illustrating an example of a filter unit in the encoding device of FIG. 3C or 3D according to some example embodiments.

FIG. 4 is a block diagram illustrating an example of a filter unit in the encoding device of FIG. 3C or 3D according to some example embodiments.

Referring to FIG. 4, the filter unit 313 may include a first filter 3131, a second filter 3132 and a third filter 3133, which are connected to each other in cascade. The first filter 3131 is an anti-aliasing filter which may filter the up-sampled input data b[n] to remove repeated images of the up-sampled input data b[n] in frequency domain. The second filter 3132 is a pulse-shaping filter may perform a pulse-shaping operation on an output of the first filter 3131. The third filter 3133 is a matched filter which may reduce a mismatch between up-sampler 312c and down-sampler 314c of FIG. 3C or may reduce a mismatch between modulator 312d and down-sampler 312d. Thus, the filter unit 313 may output the filtered data b'[n].

Figure 5A:
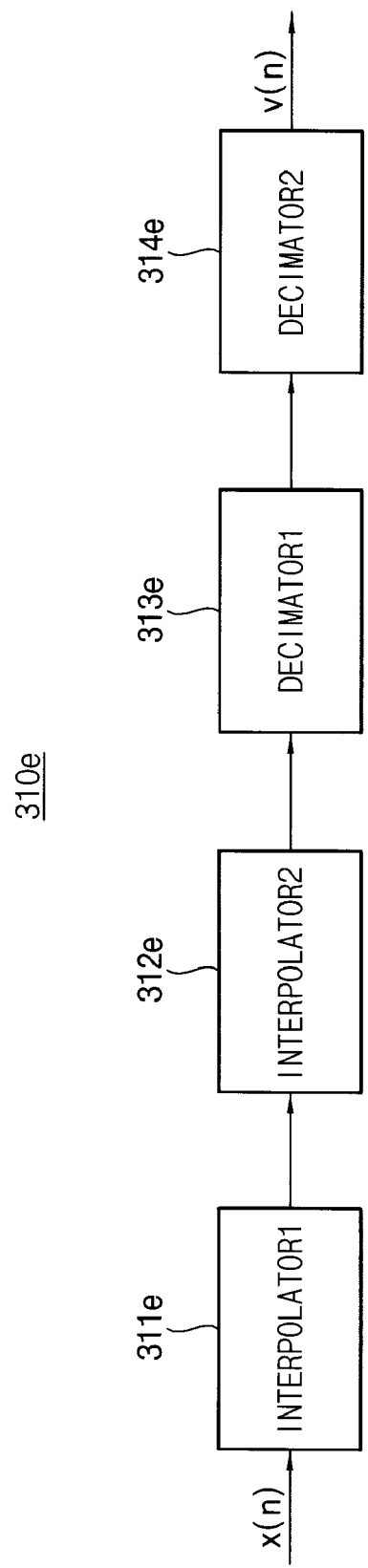
Figure 5B:
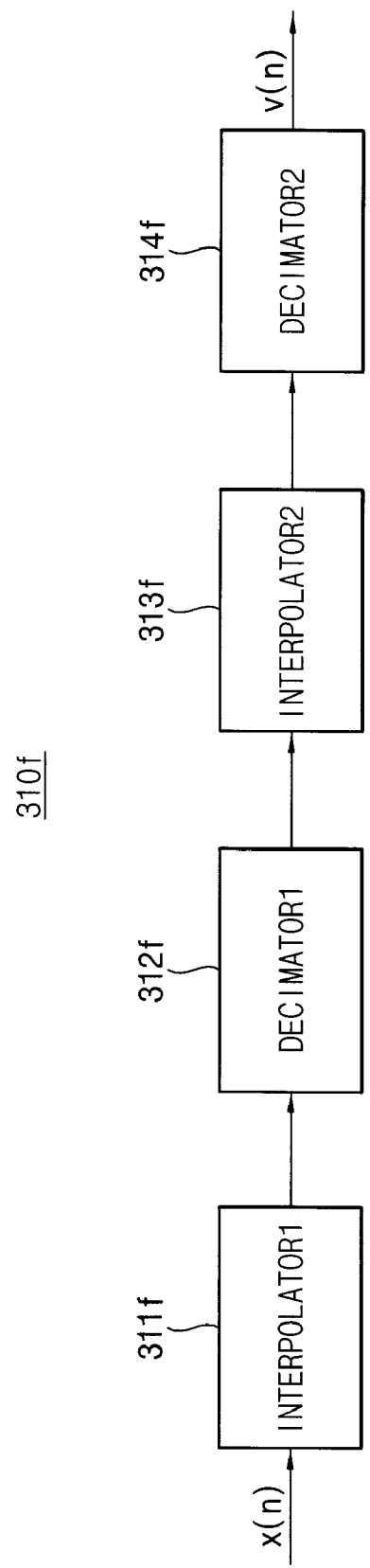

FIGS. 5A and 5B are block diagrams illustrating examples of encoding devices in the controller of FIG. 2 according to some example embodiments.

Referring to FIG. 5A, an encoding device 310e may include interpolators 311e, 312e and decimators 313e, 314e. The interpolators 311e and 312e may increase the number of samples of received data by interpolating additional samples into original samples of the received data. The decimators 313e and 314e may decrease the number of samples of received data by removing a portion of the samples among the received data. The interpolator 311e interpolates the input data x[n]. The interpolator 312e interpolates output of the interpolator 311e. The decimator 313e decimates output of the interpolator 312e. The decimator 314e decimates output of the decimator 313e and provides converted data v[n] as output. The interpolators 311e and 312e may operate based on various interpolation rates that are respectively equal to or different from decimation rates of the decimators 313e and 314e. The interpolators 311e, 312e and decimators 313e, 314e may be implemented to incorporate corresponding anti-aliasing filters such as a filter unit described with reference to FIG. 3A.

Referring to FIG. 5B, an encoding device 310f may include interpolators 311f, 313f and decimators 312f, 314f. The interpolators 311f and 313f may increase the number of samples of received data by interpolating additional samples into original samples of the received data. The decimators 313f and 314f may decrease the number of samples of received data by removing a portion of the samples among the received data. The interpolator 311f interpolates the input data x[n]. The decimator 312f decimates output of the interpolator 311f. The interpolator 313f interpolates output of the decimator 312f. The decimator 314f decimates output of the interpolator 313f and provides converted data v[n] as output. For convenience of explanation, the number of interpolators or decimators is assumed 2. However, the number of interpolators or decimators is not limited. The interpolators 311f and 313f may operate based on various interpolation rates that are respectively equal to or different from decimation rates of the decimators 312f and 314f. The interpolators 311f, 313f and decimators 312f, 314f may be implemented to incorporate corresponding anti-aliasing filters such as a filter unit described with reference to FIG. 3A.

FIGS. 6A, 6B, 6C and 6D are diagrams illustrating examples of decoding devices in the controller of FIG. 2 according to some example embodiments.

Referring to FIG. 6A, a decoding device 350a may include a filter unit 351a and a down-sampler 352a. The filter unit 351a may filter read data y[n] which is provided from the memory device 120 of FIG. 1, and may provide the filtered read data v[n]. The filter unit 351a may reduce a noise signal from the read data y[n], where the noise signal is provided by the memory device 120 of FIG. 1. In some example embodiments, the filter unit 351a may be implanted as a low-pass filter which performs low-pass filtering on the read data y[n] to generate the filtered read data v[n]. The down-sampler 352a may perform a down-sampling operation on the filtered read data v[n] and may output the down-sampled read data as the output data x[n] which corresponds to the input data x[n].

Referring to FIG. 6B, a decoding device 350b may include a filter unit 351b, a down-sampler 352b and a mapper 353b. The filter unit 351b may filter read data y[n] which is provided from the memory device 120 of FIG. 1, and may provide the filtered read data v[n]. The filter unit 351b may reduce a noise signal from the read data y[n], where the noise signal may be generated by the memory device 120 of FIG. 1. In some example embodiments, the filter unit 351b may be implanted as a low-pass filter which performs low-pass filtering on the read data y[n] to generate the filtered read data v[n]. The down-sampler 352b may perform a down-sampling operation on the filtered read data v[n] and may output the down-sampled read data as the output data x'[n]. The mapper 353b may perform a mapping operation on the down-sampled read data x'[n] based on a mapping rule to generate unmapped data, and may output the unmapped data as the output data x[n] which corresponds to the input data x[n].

In FIG. 6B, reference numerals 361, 363 and 365 are illustrating images of the read data y[n], the filtered read data v[n] and the down-sampled read data x'[n], respectively, in frequency domain, which are obtained through time-to-frequency transformation such as Fourier transformation. For example, Y[w], V[w] and X'[w] indicate Fourier transformed data of the read data y[n], the filtered read data v[n] and the down-sampled read data x'[n], respectively. For convenience of explanation, the read data y[n] is assumed to be spread between −BW/4 to BW/4 in frequency domain and contains noise data NOISE. In this case, the down-sampled read data x'[n] may be spread between −BW/2 and BW/2 when the filtered read data v[n] is decimated by 2 in order to generate the down-sampled read data x'[n]. Referring again to FIG. 3B, the bandwidth of Y[W] is almost same with the bandwidth of the mapped data X'[w].

Figure 6C:
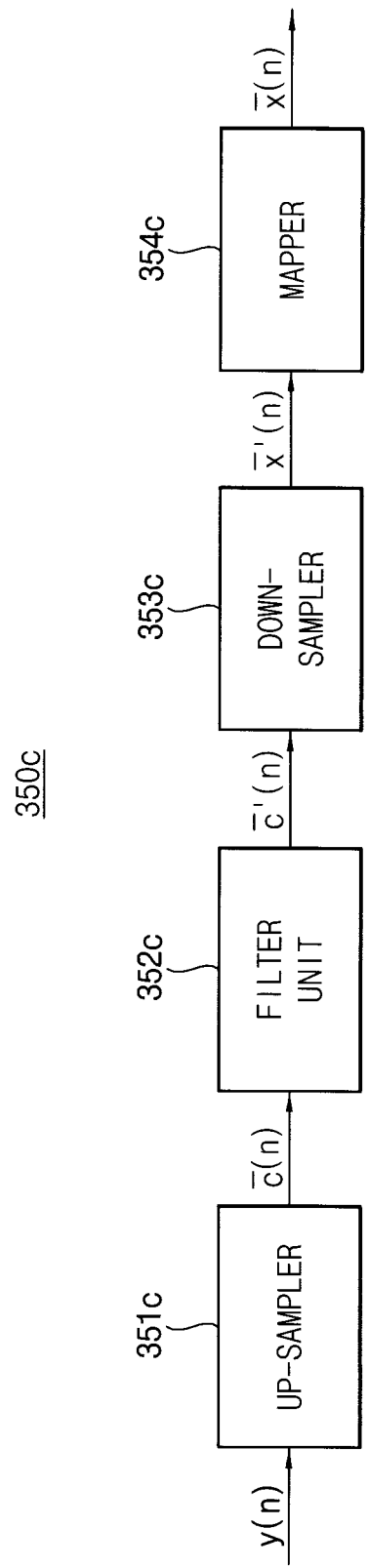

Referring to FIG. 6C, a decoding device 350c may include an up-sampler 351c, a filter unit 352c, a down-sampler 353c and a mapper 354c. The up-sampler 351c may perform an up-sampling operation on the read data y[n] to generate up-sampled read data c[n]. The filter unit 352c may filter the up-sampled read data c[n] to generate filtered read data c'[n]. The down-sampler 353c may perform a down-sampling operation on the filtered read data c'[n] to generate down-sampled read data x'[n]. The mapper 354c may perform a mapping operation on the down-sampled read data x'[n] based on a mapping rule to generate unmapped data, and may output the unmapped data as the output data x[n] which corresponds to the input data x[n].

In some example embodiments, as illustrated in FIG. 4, the filter unit 352c may include a first filter, a second filter and a third filter, which are connected to each other in cascade. The filter unit 352c may be implemented as a mixed filter which performs anti-aliasing filtering, pulse-shaping filtering and match filtering.

Figure 6D:
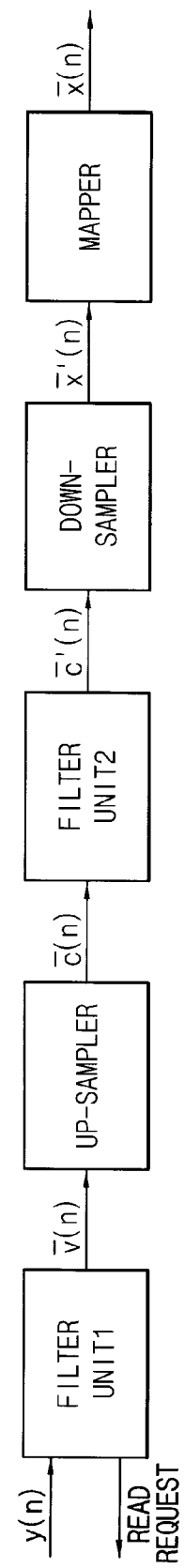

Referring to FIG. 6D, a decoding device 350c may include a first filter unit 351d, an up-sampler 352d, a second filter unit 353d, a down-sampler 354d and a mapper 355d. The first filter unit 351d may filter the read data y[n] to generate first filtered read data v[n]. The first filter unit 351d may be a low-pass filter which reduces noise included the read data y[n], where the read data y[n] is provided from the memory device 120 of FIG. 1 in response to read request of the first filter 351d. The up-sampler 352d may perform an up-sampling operation on the first filtered read data v[n] to generate up-sampled read data c[n]. The second filter unit 353d may filter the up-sampled read data c[n] to generate second filtered read data c'[n]. The down-sampler 354d may perform a down-sampling operation on the second filtered read data c'[n] to generate down-sampled read data x'[n]. The mapper 355d may perform a mapping operation on the down-sampled read data x'[n] based on a mapping rule to generate unmapped data, and may output the unmapped data as the output data x[n] which corresponds to the input data x[n].

In some example embodiments, as illustrated in FIG. 4, the filter unit 353d may include a first filter, a second filter and a third filter, which are connected to each other in cascade. The filter unit 353d may be implemented as a mixed filter which performs anti-aliasing filtering, pulse-shaping filtering and match filtering.

Figure 7:
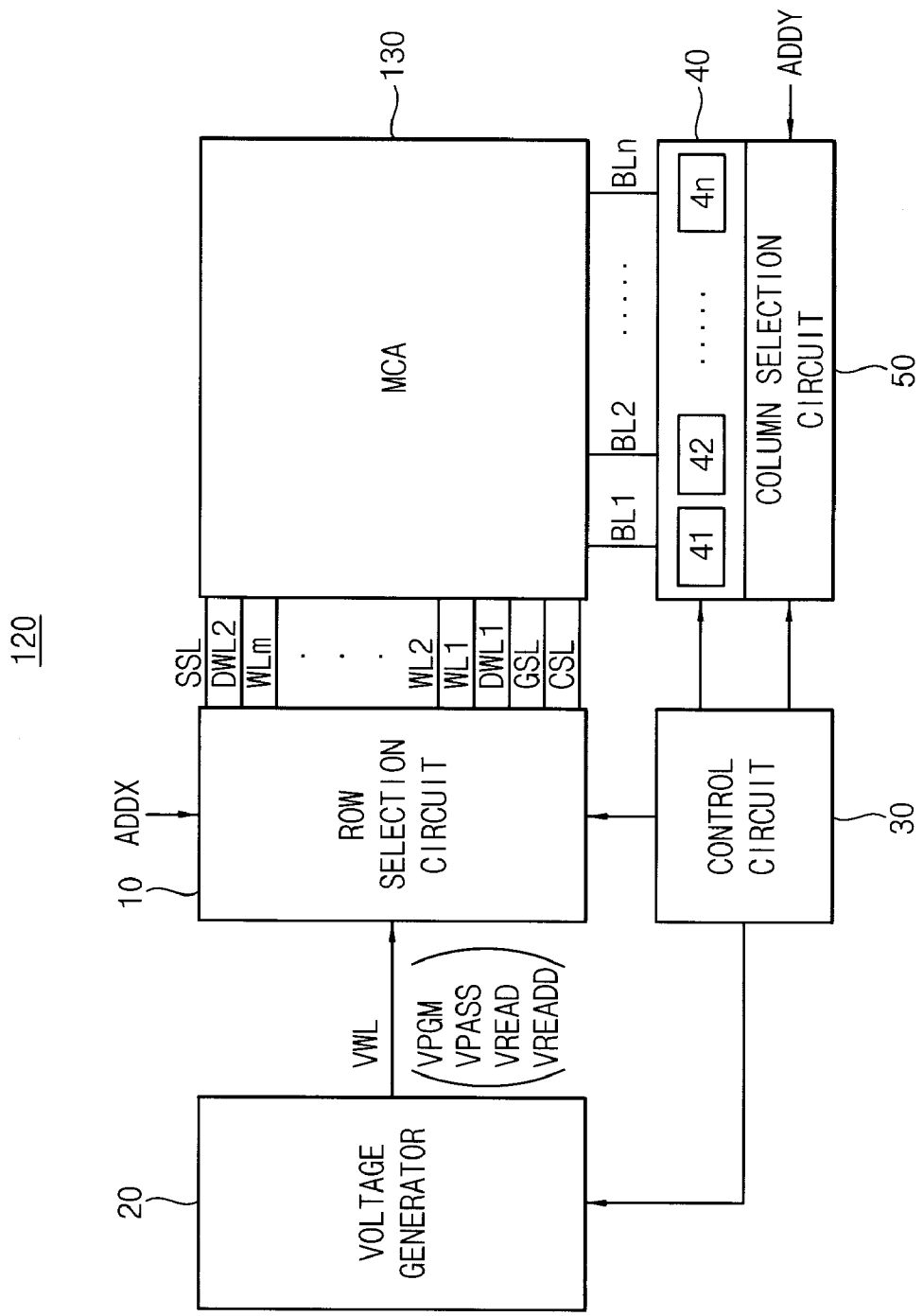
FIG. 7 is a block diagram illustrating an example of the memory device in the memory system of FIG. 1 according to some example embodiments.

FIG. 7 is a block diagram illustrating an example of the memory device in the memory system of FIG. 1 according to some example embodiments. For convenience of explanation, the memory is device 120 of FIG. 1 is assumed to be a flash memory device.

Referring to FIG. 7, the memory device 120 may include a cell array 130, a row selection circuit 10, a voltage generator 20, a page buffer block 40, a column selection circuit 50 and a control circuit 30.

The row selection circuit 10 may be connected to the memory cell array 130 through a string selection line SSL, a ground selection line GSL, dummy wordlines DWL1 and DWL2, and a plurality of wordlines WL1, WL2, ..., WLm. The row selection circuit 10 may apply word voltage VWL, program voltage VPGM, program pass voltage VPASS, read voltage VREAD, dummy voltage VREADD to the dummy wordlines DWL1 and DWL2, and the plurality of wordlines WL1, WL2, ..., WLm, based on a row address signal ADDX according to operation modes. The voltage generator 20, which generally includes a charge pump, may generate the wordline voltage VWL by boosting supply voltage.

The page buffer block 40 includes a plurality of page buffers 41, 42, ..., 4n connected between bit lines BL1, BL2, ..., BLn and the column selection circuit 50. Each of the page buffers 41, 42, ..., 4n may operate as a writing driver or a sensing amplifier according to operation modes. For example, each of the page buffers 41, 42, ..., 4n may operate as the sensing amplifier during a read operation mode, and may operate as the writing driver during a program operation mode. The column selection circuit 50 may select a bitline connected to a memory cell, where data is read from or written into the memory cell in response to a column address signal ADDY.

Figure 8:
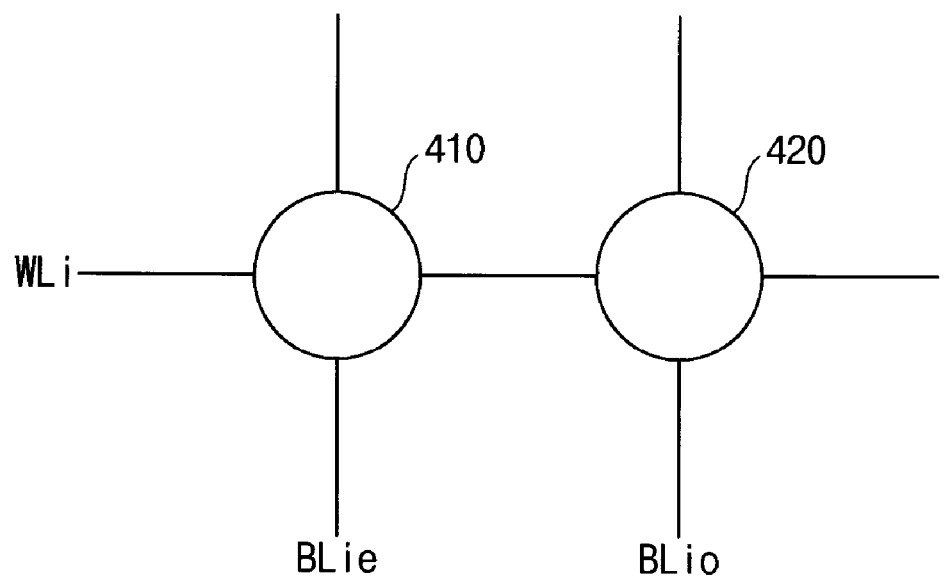
FIG. 8 is a diagram illustrating an example of multi-level cells in the memory cell array in the memory device of FIG. 7 according to some example embodiments.

FIG. 8 is a diagram illustrating an example of multi-level cells in the memory cell array in the memory device of FIG. 7 according to some example embodiments.

FIG. 8 illustrates adjacent multi-level cells 410 and 420. The multi-level cells 410 and 420 are connected to respective bitlines BLie and BLio, and are connected to a wordline WLi.

Figure 9:
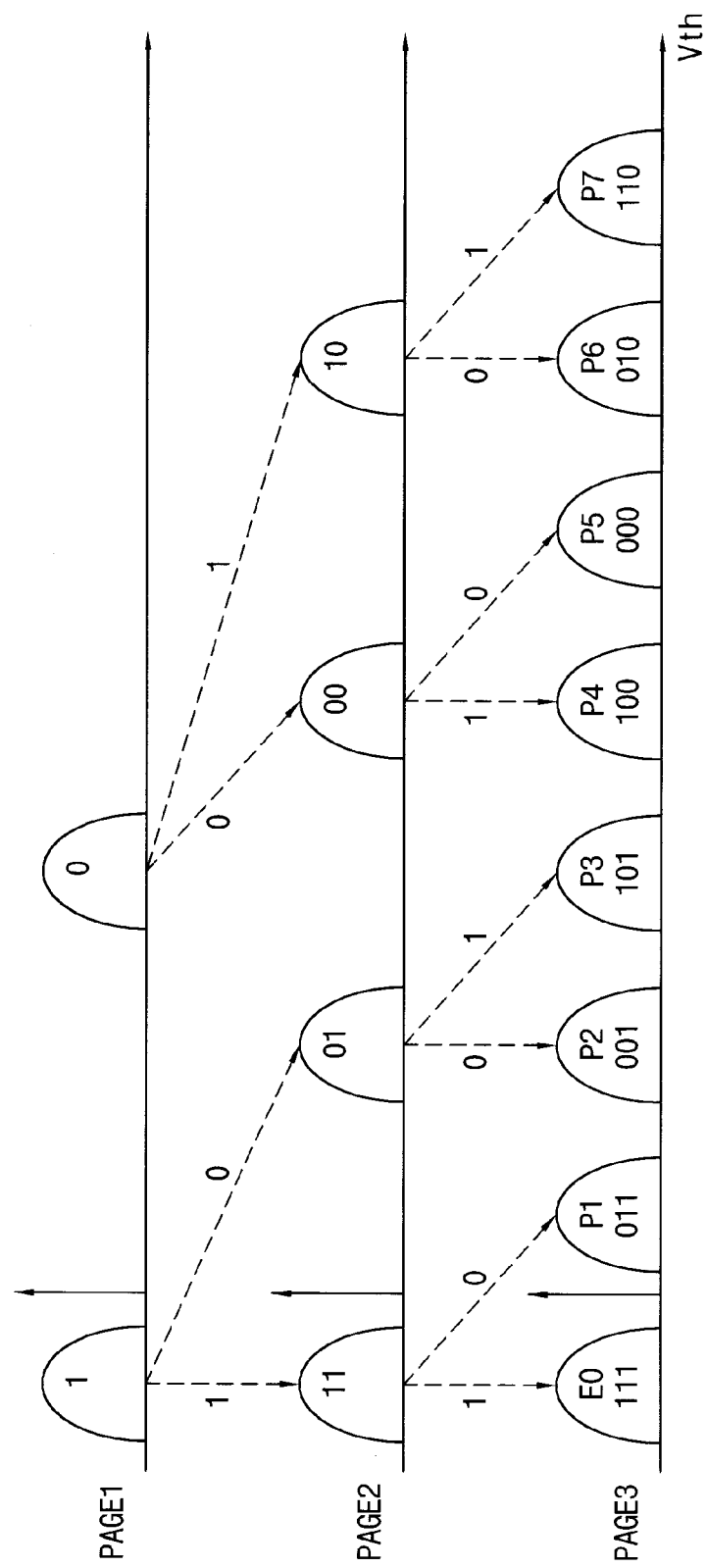
FIG. 9 is a diagram illustrating an example of distributions of threshold voltages when multi-bit data is programmed into respective multi-level memory cells of FIG. 8 according to some example embodiments.

FIG. 9 is a diagram illustrating an example of distributions of threshold voltages when multi-bit data is programmed into respective multi-level memory cells of FIG. 8 according to some example embodiments.

Referring to FIG. 9, after a first page programming which programs a first bit of a multi-bit data (e.g., the least significant bits LSBs) into the respective multi-level memory cells 410 and 420 of FIG. 8, each of the multi-level cells may have a threshold voltage distribution corresponding to bit "0" or "1". In some example embodiments, the threshold voltage distribution corresponding to bit "1" may be a threshold voltage distribution for an erased state.

After a second page programming which programs a second bit of the multi-bit data into the respective multi-level memory cells 410 and 420 of FIG. 8, the multi-level cells having the threshold voltage distribution corresponding to bit "1" may have a threshold voltage distribution corresponding to bits "11" or "01", and the multi-level cells having the threshold voltage distribution corresponding to bit "0" may have a threshold voltage distribution corresponding to bits "10" or "00".

After a third page programming which programs a third bit of the multi-bit data into the respective multi-level memory cells 410 and 420 of FIG. 8, the multi-level cells having the threshold voltage distribution corresponding to bit "11" may have a first threshold voltage distribution E0 corresponding to bits "111" or a second threshold voltage distribution P1 corresponding to bits "011", the multi-level cells having the threshold voltage distribution corresponding to bit "01" may have a third threshold voltage distribution P2 corresponding to bits "001" or a fourth threshold voltage distribution P3 corresponding to bits "101", the multi-level cells having the threshold voltage distribution corresponding to bit "00" may have a fifth threshold voltage distribution P4 corresponding to bits "100" or a sixth threshold voltage distribution P5 corresponding to bits "000", and the multi-level cells having the threshold voltage distribution corresponding to bit "10" may have a seventh threshold voltage distribution P6 corresponding to bits "010" or a second threshold voltage distribution P7 corresponding to bits "110".

When the multi-level cell 420 of FIG. 8 is programmed to have one of threshold voltage distribution illustrated in FIG. 9, the threshold voltage distribution of the multi-level cell 420 may be affected by coupling effect due to a threshold voltage distribution of the multi-level cell 410 of FIG. 8. For example, when the multi-level cell 420 of FIG. 8 is programmed to have the threshold voltage distribution E0 or P1 of FIG. 9 and the multi-level cell 410 has the threshold voltage distribution P7, the coupling effect between the multi-level cells 410 and 420 may be increased due to a relatively high difference between the threshold voltage distributions.

Figure 10:
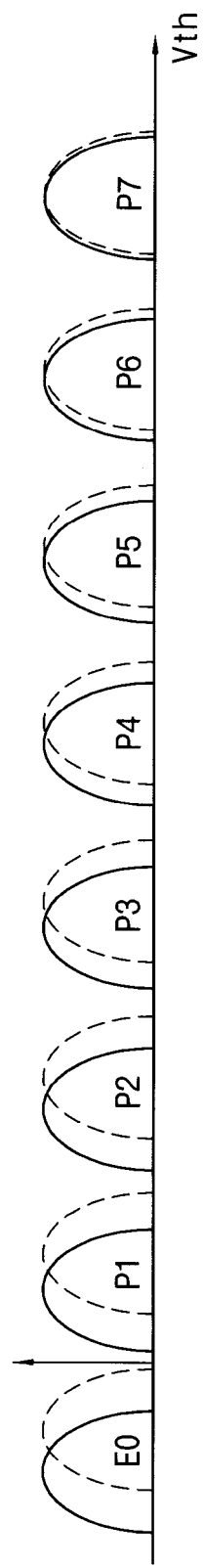
FIG. 10 is a diagram illustrating an example of distributions of threshold voltages of a multi-level memory cell when the multi-level memory is affected by adjacent multi-level memory cells according to some example embodiments.

FIG. 10 is a diagram illustrating an example of distributions of threshold voltages of a multi-level memory cell when the multi-level memory is affected by adjacent multi-level memory cells according to some example embodiments.

Referring to FIG. 10, the coupling effect between the multi-level cells 410 and 420 may be increased while the difference between the threshold voltage distributions of the adjacent multi-level cells is increased. When the multi-level cell 420 of FIG. 8 is programmed (solid-line) to have the threshold voltage within distribution E0, P1, P2, P3, P4, P5, P6 or P7 of FIG. 9, the threshold voltage of the multi-level cell 410 may be distorted (e.g., its corresponding distribution or acceptable threshold range may be shifted as shown by the dotted-line) because of the coupling effect between the multi-level cells 410 and 420.

Figure 11:
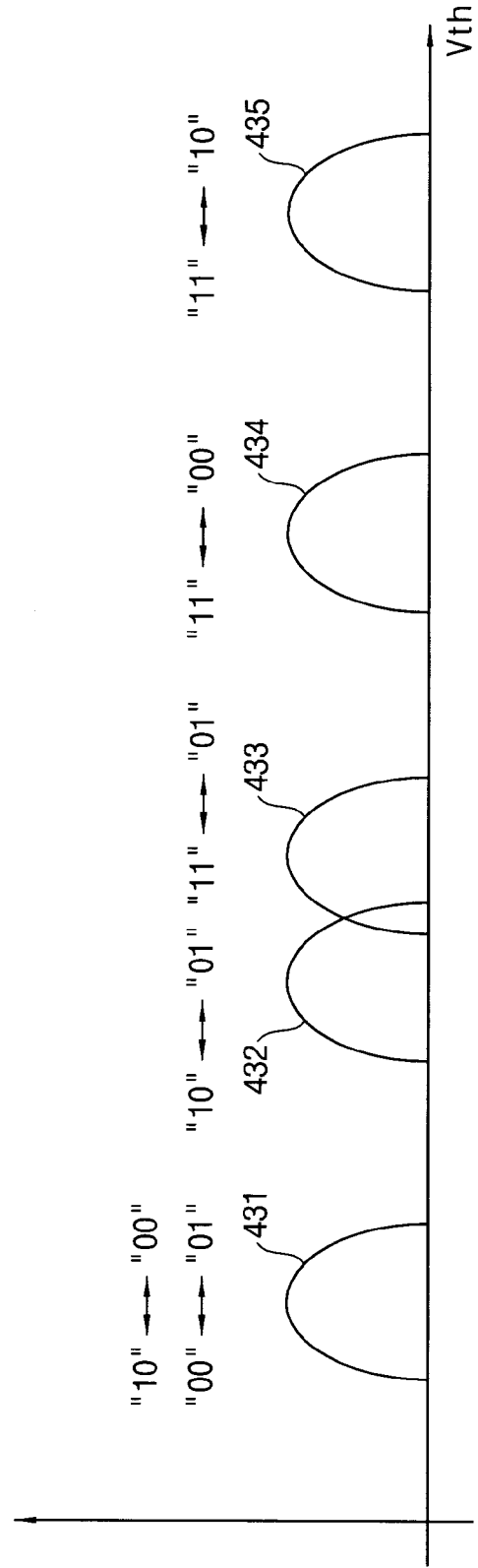
FIG. 11 is a diagram illustrating an example of possible threshold voltage distribution differences between two adjacent multi-level memory cells according to some example embodiments.

FIG. 11 is a diagram illustrating an example of possible threshold voltage distribution differences between two adjacent multi-level memory cells according to some example embodiments. FIG. 11 represents a case of 2-bit programming in contrast to the previously illustrated FIGS. 9 and 10.

Referring to FIG. 11, a reference numeral 431 represents difference between threshold voltage distributions when adjacent multi-level memory cells have threshold voltage distributions corresponding to respective data bits "10" and "00" (or, "00" and "10"). A reference numeral 432 represents difference between threshold voltage distributions when adjacent multi-level memory cells have threshold voltage distributions corresponding to respective data bits "10" and "01". A reference numeral 433 represents difference between threshold voltage distributions when adjacent multi-level memory cells have threshold voltage distributions corresponding to respective data bits "11" and "01". A reference numeral 434 represents difference between threshold voltage distributions when adjacent multi-level memory cells have threshold voltage distributions corresponding to respective data bits "11" and "00". A reference numeral 435 represents difference between threshold voltage distributions when adjacent multi-level memory cells have threshold voltage distributions corresponding to respective data bits "11" and "10".

Referring to FIG. 11, the difference between threshold voltage distributions when adjacent multi-level memory cells have threshold voltage distributions corresponding to respective data bits "11" and "10" may be relatively higher than any other differences of threshold voltage distributions of FIG. 9. When the difference between threshold voltage distributions becomes higher, the coupling effect between the adjacent memory cells becomes stronger. The threshold voltage distributions are varied due to such coupling effect, program disturb and back pattern dependency. When the threshold voltage for a data symbol of data bits is distributed over an unexpected region which is overlapped with threshold distributions for other data symbols, the programming reliability of the memory system may be decreased.

Figure 12:
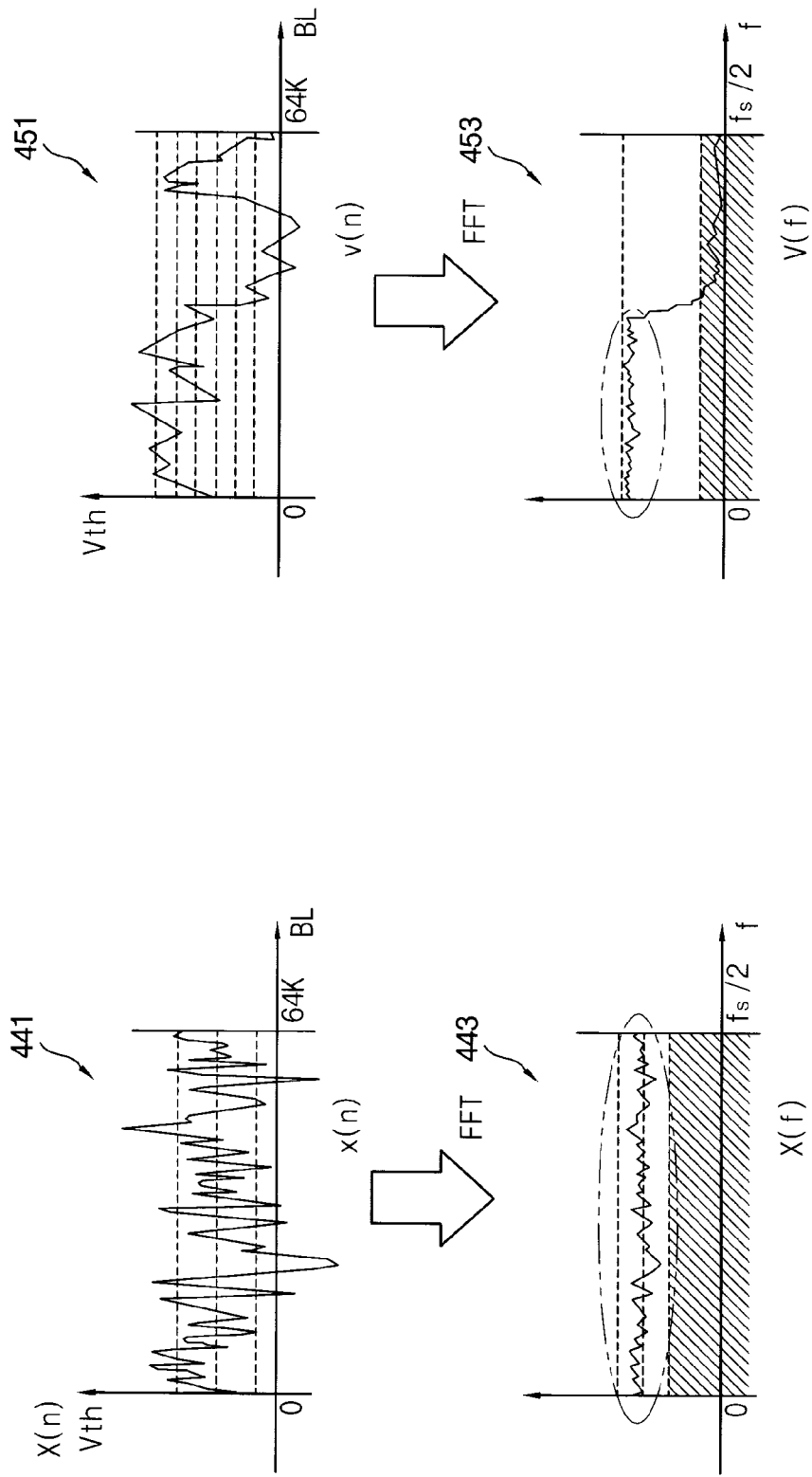
FIG. 12 is a diagram illustrating an example of effects of the memory system of FIG. 1 according to some example embodiments.

FIG. 12 is a diagram illustrating an example of effects of the memory system of FIG. 1 according to some example embodiments.

In FIG. 12, reference numeral 441 represents a sequence of threshold voltages of multi-level cells along a wordline (e.g., along a page of flash memory) when the input data x[n] is programmed in the memory cell array 130 according to a conventional programming method (e.g., without the conversion by converting device 300). Reference numeral 443 represents a Fourier transformation of the sequence of threshold voltages 441. Reference numeral 451 represents a sequence of threshold voltages of multi-level cells along a wordline when the converted data v[n] (e.g., data x[n] converted by converting device 300) is programmed in the memory cell array 130 according to some example embodiments. Reference numeral 453 represents a Fourier transformation of the sequence of threshold voltage of the reference numeral 451.

Referring to FIG. 12, a high frequency component of the sequence of threshold voltage, which indicates high differences between adjacent multi-level memory cells, may be reduced in magnitude by converting the input data x[n] into the converted data v[n]. By reducing the high frequency region illustrated in the reference numeral 443 through converting the input data x[n] into the converted data v[n], information of the input data x[n] may be compressed within a low frequency region of the reference numeral 453. Thus the coupling effect caused by a high frequency fluctuation of the sequence of the threshold voltage in the reference numeral 441 may be reduced after the input data x[n] is converted into encoded data such as the converted data v[n] represented as the reference numeral 451. "Frequency" as used throughout this disclosure does not need to represent a variation per unit time, but rather may represent a variation per unit length. For example, frequency may represent a variation of threshold voltages per unit length along a page of flash memory. Alternatively, frequency may represent a variation of threshold voltages per cell or per data element (or per a number of cells or data elements). Similarly, terms used in this application related to "frequency" (such as "bandwidth") and operations used in this application (e.g., the Fourier transform operation) need not reference a frequency representing a variation per unit time.

Figure 13:
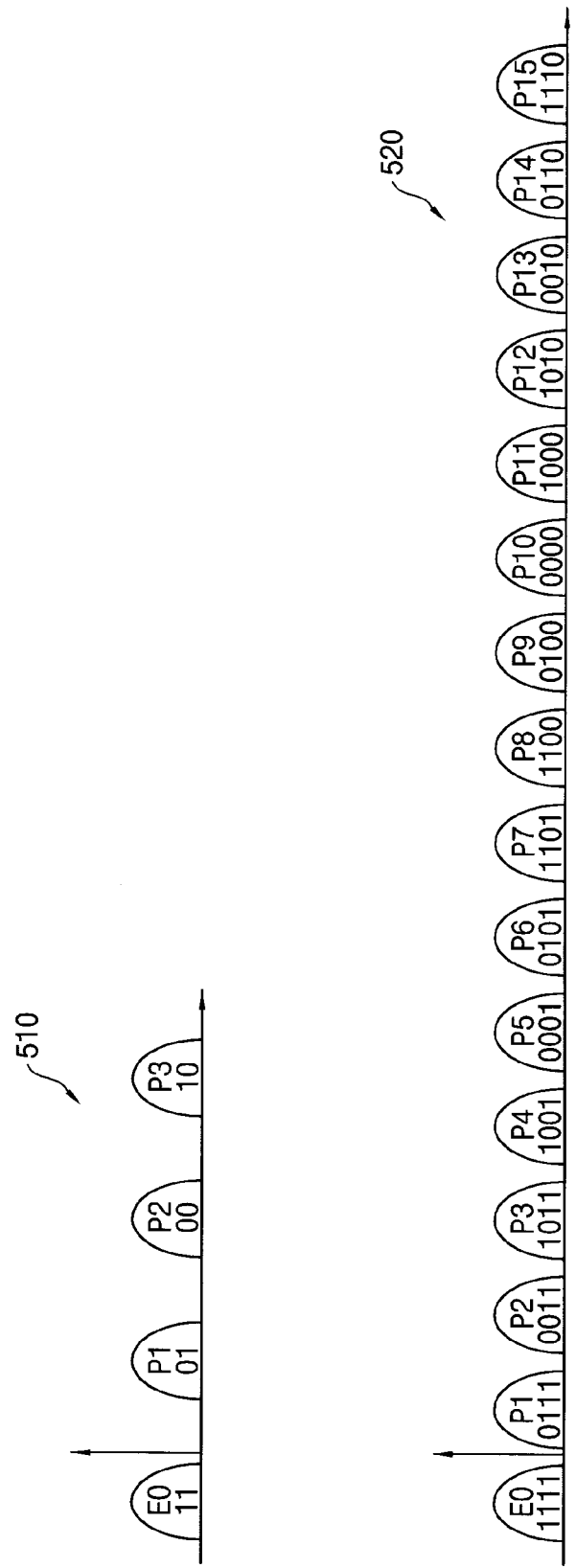
FIG. 13 is a diagram illustrating an example of a process of transforming a bandwidth according to some example embodiments.

FIG. 13 is a diagram illustrating an example of a process of transforming a bandwidth according to some example embodiments.

In FIG. 13, a process of converting a 2-bit data sequence into a 4-bit data sequence is illustrated. When each data element x[i] is 2-bit data, and a sequence of the input data x[n] is represented as "01", "10", "00", "11", "10", "11", "11" and "10" which corresponds to a sequence of threshold voltage distributions, P1, P3, P2, E0, P3, E0, E0 and P3 (see reference numeral 510), a 4-bit data sequence may be generated or packed as "0110", "0011", "1011" and "1110" which corresponds to a sequence of threshold voltages, P14, P2, P3 and P15 (see reference numeral 520). The mapper 311b of FIG. 3B may perform a mapping operation on the input data x[n] to generate a symbolic sequence of 14, 2, 3, 15 based on the threshold voltage distributions illustrated in FIG. 13.

The up-sampler 312b may insert symbols such as E0 (i.e., "1111") of the erased state between every adjacent symbols of the packed sequence P14 (i.e., "0110"), P2 (i.e., "0011"), P3 (i.e., "1011"), P15 (i.e., "1110"). This kind of inserting process is known as a zero-padding method. Thus, the up-sampled data b[n] may be an up-sampled (or padded) sequence of P14 (i.e., "0110"), E0 (i.e., "1111"), P2 (i.e., "0011"), E0 (i.e., "1111"), P3 (i.e., "1011"), E0 (i.e., "1111") and P15 (i.e., "1110").

The filter unit 313b, which is implemented as a low-pass filter, may filter the up-sampled (or padded) sequence to replace the erased state "1111" (E0) with an intermediate value of neighboring samples in the padded sequence. Referring to the above example sequence, P14 (i.e., "0110"), E0 (i.e., "1111"), P2 (i.e., "0011"), E0 (i.e., "1111"), P3 (i.e., "1011"), E0 (i.e., "1111") and P15 (i.e., "1110"), the filter unit 313b may substitute the first symbol of the erased state E0 (i.e., "1111") for an intermediate value P8 (i.e., "1100") between P14 (i.e., "0110") and P2 (i.e., "0011") by performing a low-pass filtering operation. The filter unit 313b may substitute the second symbol of the erased state E0 (i.e., "1111") for an intermediate value P2 (i.e., "0011") between P2 (i.e., "0011") and P3 (i.e., "1011") with reference to the reference numeral 520 of FIG. 13. The filter unit 313b may substitute the third symbol of the erased state E0 (i.e., "1111") for an intermediate value P9 (i.e., "0100") between P3 (i.e., "1011") and P15 (i.e., "1110") with reference to the reference numeral 520 of FIG. 13. Thus, the filter unit 313b may generate the converted data v[n] of P14 (i.e., "0110"), P8 (i.e., "1100"), P2 (i.e., "0011"), P2 (i.e., "0011"), P3 (i.e., "1011"), P9 (i.e., "0100") and P15 (i.e., "1110") by performing the low-pass filtering on the up-sampled or padded data. The filter unit 313b may eliminate or remove undesired frequency components which may be inserted into the packed sequence during the up-sampling or padding operation. As described with reference to FIG. 13, the undesired frequency components may be relatively high frequency components which have arisen from the padding or up-sampling operation, for example, the erased state "1111" E0 padding operation performed by the up-sampler 312b.

Referring again to FIG. 3B, in frequency domain, the mapped data X'[w] may have a bandwidth similar to a bandwidth of the input data. The up-sampled data B[w] may have half of the bandwidth of the mapped data X'[w], spread between −BW/4 and BW/4. In this case, the bandwidth of the input data x[n] is assumed to have a bandwidth of BW.

In an example read operation of the memory system 100, with reference to FIG. 6B, the filter unit 351b reduces the noise included in the read data y[n] which may be represented as the example sequence of P14 (i.e., "0110"), P8 (i.e., "1100"), P2 (i.e., "0011"), P2 (i.e., "0011"), P3 (i.e., "1011"), P9 (i.e., "0100") and P15 (i.e., "1110"). The down-sampler 352b may decimate the read data y[n], and may extract a sequence of P14 (i.e., "0110"), P2 (i.e., "0011"), P3 (i.e., "1011") and P15 (i.e., "1110") from the sequence of the read data y[n], P14 (i.e., "0110"), P8 (i.e., "1100"), P2 (i.e., "0011"), P2 (i.e., "0011"), P3 (i.e., "1011"), P9 (i.e., "0100") and P15 (i.e., "1110"). The mapper 353b of FIG. 6B may unpack the symbols of the sequence to generate a sequence of the output data x[n], P1 (i.e., "01"), P3 (i.e., "10"), P2 (i.e., "00"), E0 (i.e., "11"), P3 (i.e., "10"), E0 (i.e., "11"), E0 (i.e., "11") and P3 (i.e., "10"), where symbols correspond to respective threshold voltage distributions of the reference numeral 510 of FIG. 13.

The example embodiments may be employed in various types of encoding and decoding devices. In contrast to the above described mapping operation which is based on the threshold voltage Vth distributions, the mapper 311b of FIG. 3B may perform a mapping operation on the packed or unpacked sequence based on the difference between the threshold voltage distributions. For example, referring to the reference numeral 520 of FIG. 13, the mapper 311b of FIG. 3B may perform a mapping operation on the input data x[n] based on the sequence of P15, P14, P13, P12, P11, P10, P9, P8, P7, P6, P5, P4, P3, P2 and P1, which has a descending order based on the magnitude of the threshold voltages corresponding to respective symbols. For another example, in contrast to the above order, the mapper 311b of FIG. 3B may perform a mapping operation on the input data x[n] based on the sequence of P9, P10, P11, P12, P13, P14, P15, P1, P2, P3, P4, P5, P6, P7 and P8, which has a descending order based on the differences of the threshold voltage distributions corresponding to respective symbols. The mapper 311b of FIG. 3B may perform a mapping operation on the input data x[n] based on the magnitude of the threshold voltages or based on the differences of the threshold voltage distributions. In some example embodiments, the mapper 311b may perform a trellis mapping operation or a sparse mapping operation on the input data x[n]. Thus, the mapper 311b may generate the mapped data x'[n].

Figure 14:
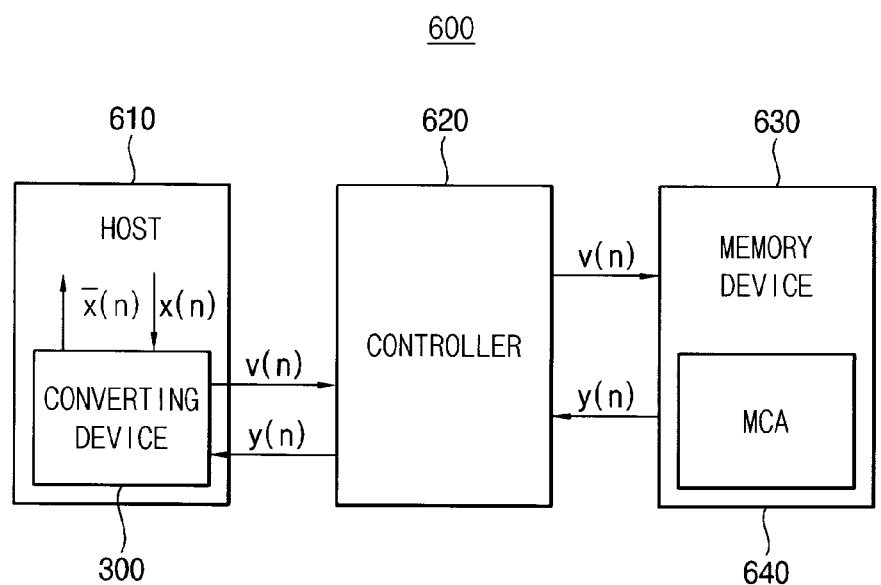
FIG. 14 is a block diagram illustrating a memory system according to other example embodiments.

FIG. 14 is a block diagram illustrating a memory system according to other example embodiments.

Referring to FIG. 14, a memory system 600 includes a host 610, a controller 620 and at least one memory device 630. The host 610 may include the converting device 300 of FIG. 1. To explain a data flow during a program operation, the converting device 300 may receive an input data x[n] from the host 610 and may convert the input data x[n] by varying the bandwidth of the input data x[n] to generate a converted data v[n]. The converting device 300 may provide the converted data v[n] to the memory cell array 640 through the controller 620. The memory device 630 may program the converted data v[n] in a memory cell array 640. To explain a data flow during a reading operation, the controller 620 may read a read data y[n] from the memory device 630 and may transmit the read data y[n] to the converting device 300. The converting device 300 may convert the read data y[n] into an output data x[n] corresponding to the input data x[n] to provide the output data x[n] to other devices in the host 610. In another example embodiment, the controller 620 may be omitted from the memory system 100.

Figure 15:
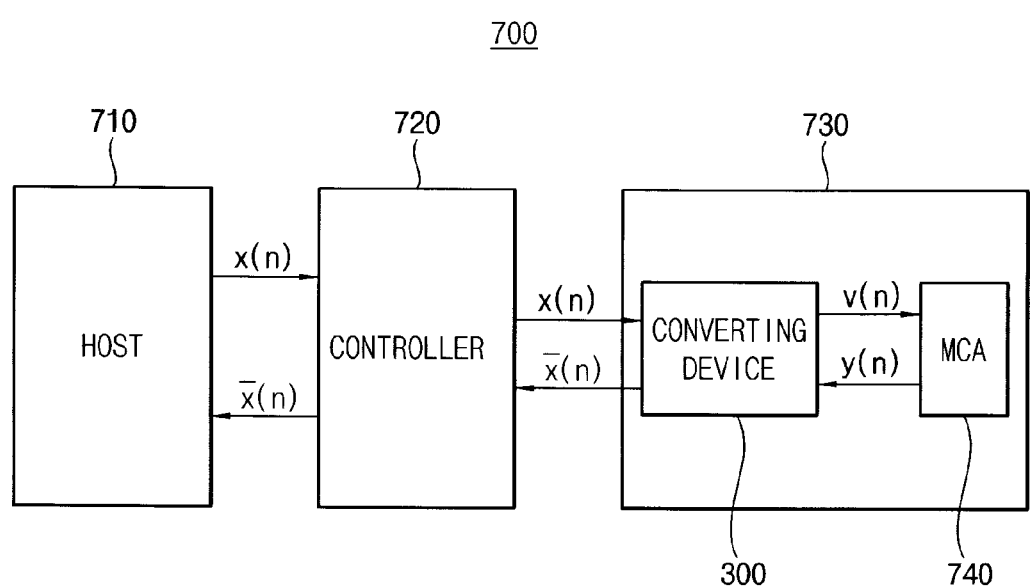
FIG. 15 is a block diagram illustrating a memory system according to still other example embodiments.

FIG. 15 is a block diagram illustrating a memory system according to still other example embodiments.

Referring to FIG. 15, a memory system 700 includes a host 710, a controller 720 and at least one memory device 730. The memory device 730 may include a memory cell array 740 and the converting device 300 of FIG. 1. For explaining a data flow during a program operation, the converting device 300 may receive an input data x[n] from the host 610 through the controller 720 and may convert the input data x[n] by varying the bandwidth of the input data x[n] to generate a converted data v[n]. The converting device 300 may provide the converted data v[n] to the memory cell array 740. The memory device 730 may program the converted data v[n] into the memory cell array 740. For explaining a data flow during a read operation, the converting device 300 may read a read data y[n] from the memory device 630 and may convert the read data y[n] into an output data x[n] corresponding to the input data x[n] to provide the output data x[n] to the host 710 through the controller 720. In the example embodiments according to FIG. 15, the controller 720 may be omitted from the memory system 100. The memory cell array 740 may include multi-level memory cells.

The memory device and/or the controller according to some example embodiments may be implemented using various packaging method. The flash memory device and/or the memory controller according to the example embodiment may be mounted using Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), etc. The flash memory device and the memory controller may be implemented in a memory card or a solid state drive/disk (SSD). In this case, the memory controller may be configured to communicate with a host such as the host 110 of FIG. 1 using interfaces such as Universal Serial Bus (USB), Multimedia Card (MMC) interface, Advance Technology Attachment (ATA), Serial-ATA, Parallel-ATA, Small Computer System Interface (SCSI), Enhanced Small Disk Interface (ESDI), Integrated Drive Electronics (IDE), etc.

FIG. 16 illustrates an exemplary method of operating a flash memory device. In step S1610, input data is received. The input data may be x[n] input data of any of the embodiments described above. Data x[n] may represent the input data in a sequence or array of data elements. Each of the data elements of the input data may have a corresponding threshold value which may represent such data element when the data element value is stored in a memory cell of a flash memory, such a multi-level NAND flash memory. In step S1620, the input data is converted into converted data. The converted data may be v(n) described in any of the embodiments described above. The converting step operates to reduce a frequency of threshold variations. For example, the converting step reduces an amount of threshold variations among adjacent data elements of the converted data when each data element of the converted data elements is represented by the same set of threshold values noted above. This reduction of the amount of threshold variations may be reduced in a manner similar to any one of the embodiments noted above. The reduction of the amount of threshold variations may be a reduction of an average amount of threshold deviation between adjacent memory cells along a line of memory cells (such as a page or bit line of a flash memory) as compared to when the input data is stored along such a line of memory cells without conversion. E.g., the reduction of a frequency of threshold variations and/or reduction of the amount of threshold variations may result in an average differential between adjacent cells of a page (or bit line) of the flash memory for v[n] being less than that of x[n] when n denoted a relative position along the page (or bit line) of the flash memory. In step S1630, the converted data (e.g., v[n]) is stored in the flash memory. In step S1640, data v[n] is read from the flash memory. In step S1650, converted data (e.g., v[n]) is transformed by a reconverting device, such as in accordance with any one of the embodiments described above. The transformed data may be the same as x[n] or may have acceptable deviations. In step 1650, the transformed data is transmitted to a host.

While the above example embodiments have been described to reduce a rate of threshold variation between memory cells along a word line, the invention has broader applicability. For example, data conversion may operate to lower a frequency of threshold variations of cells along a bit line of a memory, such as a NAND flash memory. Such an alternative may be useful to reduce coupling effects between adjacent cells along a bit line. In addition, the conversion process may reduce a frequency of threshold variations in more than one dimension, such as two dimensions (e.g., both a word line and bit line directions). In addition, the variations to be reduced by the conversion process may operate in a vertical direction (in the case of a stacked memory or 3D memory) either by itself or in addition to the above described frequency reduction embodiments. In addition, alternative conversion processes may be used other than those described above. For example, mathematical transformation functions may operate on the input data x[n] as a conversion process and the inverse mathematical transformation function may operate on the data y[n] output from the memory device. Further, methods of conversion are also contemplated, such as converting the input data x[n] to an equivalent d.c. balanced encoded data, such that the deviation of concern is a number of threshold distributions between adjacent cells rather than the number or 1's or 0's between subsequently received symbols. For example, odd threshold voltage distributions P1, P3, P5 . . . P15 of FIG. 13's 520 may be considered "inverted" data—representing data equivalent to even threshold voltage distributions P14, P12, P10 . . . E0, respectively. Converter may select a normal threshold range or an inverted threshold range for storing the same data depending on the threshold value of a neighboring memory cell so that the threshold deviation may be minimized.

The memory systems according to example embodiments are capable of improving the reliability of programmed data through changing the bandwidth of threshold voltages of data to be programmed into the memory cell array. Accordingly, the described example embodiments may be adapted for various memory systems including memory devices such as a three-dimensional memory device.

The described embodiments may be employed in different type of devices or systems that stores trim codes and need to temporally calibrate the trim codes for some purposes. More-over, the described embodiments may be employed in semiconductor devices such as flash memory devices that operate in various operation modes and operation conditions and need to trim relatively high operating voltages.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A memory system comprising:
   a memory device including a non-volatile memory cell array which includes a plurality of memory cells, the memory device configured to alter a threshold value of corresponding ones of the plurality of memory cells to store corresponding data, wherein further programming of one or more neighboring cells of a first memory cell being effective to alter a reading of the threshold value of the first cell; and
   a data converting device including an encoding device configured to convert input data into converted data by lowering a bandwidth corresponding to the input data, and configured to provide the converted data to the memory device, the bandwidth representing a range of a threshold variation per unit length of a line of memory cells along a length of the memory device when corresponding data were to be stored in the line of memory cells.

2. The memory system of claim 1, wherein the encoding device performs interpolation operation on the input data to generate the converted data.

3. The memory system of claim 2, wherein the encoding device generates the converted data by further performing decimation operation on the input data.

4. The memory system of claim 1, wherein the encoding device includes:
   an up-sampler configured to perform an up-sampling operation on the input data; and
   a filter unit configured to filter the up-sampled input data to generate the converted data.

5. The memory system of claim 4, wherein the filter unit includes:
   a first filter configured to filter the up-sampled input data to remove repeated images of the up-sampled input data in frequency domain;
   a second filter configured to perform a pulse-shaping operation on an output of the first filter; and
   a third filter configured to reduce a mismatch of an output of the second filter with a down sampler connected to the third filter.

6. The memory system of claim 4, wherein the up-sampler reduces a bandwidth corresponding to the input data such that the up-sampled input data has a bandwidth corresponding to an up-sampling frequency.

7. The memory system of claim 4, wherein the encoding device further includes a mapper configured to perform a mapping operation on the input data, and configured to provide the mapped input data to the up-sampler.

8. The memory system of claim 7, wherein the mapper performs the mapping operation on the input data based on threshold voltage levels of programmed memory cells.

9. The memory system of claim 7, wherein the mapper performs the mapping operation on the input data based on distributions of threshold voltage levels of programmed memory cells.

10. The memory system of claim 1, wherein the data converting device further includes a decoding device configured to convert read data through a reverse process with respect to a converting process of the encoding device and configured to output the converted read data as output data, the read data being read from the memory cell array.

11. The memory system of claim 10, wherein the decoding device performs decimation operation on the read data and outputs the decimated read data as the output data.

12. The memory system of claim 11, wherein the decoding device includes:
    a filter unit configured to filter the read data; and
    a down-sampler configured to perform a down-sampling operation on the filtered read data and configured to output the down-sampled read data as the output data.

13. The memory system of claim 12, wherein the decoding device further includes a mapper configured to perform a mapping operation on the down-sampled read data to generate mapped data, and configured to output the mapped data as the output data.

14. The memory system of claim 12, wherein the down-sampler increases a bandwidth of the filtered read data such that the down-sampled read data has a bandwidth corresponding to a down-sampling frequency.

15. The memory system of claim 11, wherein the decoding device includes:
    a first filter unit configured to perform a low-pass filtering operation on the read data;
    an up-sampler configured to perform an up-sampling operation on the low-pass filtered read data to generate up-sampled data;
    a second filter unit configured to filter the up-sampled data to generate filtered data;
    a down-sampler configured to perform a down-sampling operation on the filtered data to generate down-sampled data; and
    a mapper configured to perform a mapping operation on the down-sampled data and configured to output the mapped down-sampled data as the output data.

16. The memory system of claim 1, wherein each of the memory cells is a multi-level memory cell.

17. A flash memory device comprising:
    a flash memory; and
    a flash memory controller, the flash memory controller including an encoder and a decoder, the encoder operative to receive data from a host system, encode the received data and provide the encoded data to the flash memory during a program operation of the flash memory to store the encoded data to a page of the flash memory, the decoder operative to receive encoded data from the flash memory, decode the encoded data from the flash memory during a read operation,
    wherein the encoding by the encoder is operative to reduce an amount of threshold voltage variations between adjacent cells of the page of the flash memory storing the encoded data that as compared to an amount of threshold voltage variations between adjacent cells of the page of the flash memory which would have occurred upon storing the received data without conversion by the encoder.

18. The flash memory device of claim 17, wherein the reduced amount of threshold variations includes a reduction of an average magnitude of threshold voltage differential of adjacent memory cells along the page of the flash memory.

19. A method of operating a flash memory device, comprising:
- receiving input data, data elements of the input data being represented in a sequence of data elements of the input data, each data element having one of a plurality of threshold voltages to represent the input data in a multi-level cell flash memory;
- converting the input data to converted data, the converted data being represented in a sequence of data elements of the converted data, each data element of the converted data having one of the plurality of threshold voltages to represent the converted data in the multi-level cell flash memory; and
- storing the converted data in a page of flash memory in a sequence of memory cells along the page of flash memory corresponding to the sequence of data elements of the converted data,
- wherein converting the input data to converted data includes reducing an amount of threshold variations among adjacent cells along the page of flash memory as compared to an amount of threshold variations among adjacent memory cells along the page of flash memory which would have occurred if the received input data had been stored in the page of the flash memory in the sequence of data elements of the input data.

20. The method of claim 19, wherein the reduced amount of threshold variations includes a reduction of an average magnitude of threshold voltage differential of adjacent memory cells along the page of the flash memory.

* * * * *